(12) United States Patent
Zhu

(10) Patent No.: US 8,138,762 B2
(45) Date of Patent: Mar. 20, 2012

(54) COIL DECOUPLING FOR AN RF COIL ARRAY

(75) Inventor: Haoqin Zhu, Winnipeg (CA)

(73) Assignee: IMRIS Inc., Winnipeg, Manitoba (CA)

( * ) Notice: Subject to any disclaimer, the term of this patent is extended or adjusted under 35 U.S.C. 154(b) by 120 days.

(21) Appl. No.: 12/546,148

(22) Filed: Aug. 24, 2009

(65) Prior Publication Data

US 2011/0043209 A1    Feb. 24, 2011

(51) Int. Cl.
*G01V 3/00*    (2006.01)
(52) U.S. Cl. .......................... 324/322; 324/318
(58) Field of Classification Search .............. 324/322, 324/318
See application file for complete search history.

(56) References Cited

U.S. PATENT DOCUMENTS

| 6,160,400 | A   | * | 12/2000 | Friedrich et al. | 324/322 |
| 6,326,789 | B1  | * | 12/2001 | Yoshida et al. | 324/318 |
| 6,414,488 | B1  |   | 7/2002  | Chmielewski |  |
| 6,459,265 | B1  | * | 10/2002 | Lou et al. | 324/322 |
| 6,512,374 | B1  |   | 1/2003  | Misic et al. |  |
| 6,727,703 | B2  |   | 4/2004  | Lee |  |
| 7,616,000 | B2  | * | 11/2009 | Chu et al. | 324/322 |
| 7,723,988 | B2  | * | 5/2010  | Schwilch et al. | 324/322 |

OTHER PUBLICATIONS

Reykowski, et al. Design of Matching Networks for Low Noise Preamplifiers. Magnetic Resonance in Medicine 1995, vol. 33, pp. 848-852.

Lee et al. Coupling and Decoupling Theory and Its Application to the MRI Phased Array, Magnetic Resonance in Medicine, 2002, vol. 48, pp. 203-213.

* cited by examiner

*Primary Examiner* — Louis Arana

(74) *Attorney, Agent, or Firm* — Adria D. Battison; Ade & Company Inc

(57) ABSTRACT

An MRI phase RF coil array includes a plurality of separate RF coil elements where each coil element has a pre-amplifier circuit with a conditioning circuit in advance of the transistor including an inductor and capacitors connected across the input of preamplifier. Each of the coil elements has a preamplifier decoupling parallel resonant circuit for generating a tuned high impedance across the ends of the coil so as to inhibit coupling in the coil from signals in adjacent and non-adjacent coils of the array. The decoupling circuit comprises a fixed first capacitor across the ends, a second variable capacitor in one of the leads, a further capacitor in the conditioning circuit, all of which define a capacitance which co-operates with the inductance defined by the inductor of the conditioning circuit of preamplifier to form the parallel resonant circuit to generate the high impedance.

14 Claims, 2 Drawing Sheets

COIL DECOUPLING FOR AN RF COIL ARRAY

This invention relates to an RF coil array for use in a magnetic resonance system for detecting MR signals.

BACKGROUND OF THE INVENTION

The following relates to phased arrays of radio frequency (RF) coils for magnetic resonance imaging, and will be described with particular reference thereto. It finds application more generally in conjunction with magnetic resonance imaging, magnetic resonance spectroscopy, and other magnetic resonance applications.

Many techniques increasingly employ arrays of surface coils to act as a transmit and receive antenna. Each surface coil of the array typically includes a conductive RF loop, and required electronic components providing required features including frequency tuning the magnetic resonance frequency and matching to required impedance (e.g. 50 ohm); a pre-amplifier for amplifying the received signal from the subject in the magnet; coil detuning during the transmit phase; coil decoupling from adjacent and non-adjacent coil elements of the phased array coils. The required electronics are typically positioned close to the conductive RF loop.

Normally, each element of the phased array coil includes the conductive coil loop, a preamplifier decoupling network and a preamplifier, typically the preamplifier includes a transistor amplifier preceded by conditioning circuit.

The standard preamplifier decoupling network consists of capacitors and inductors which form a parallel resonant circuit with the conditioning circuit of the preamplifier and the output capacitor of the coil loop and blocks current from flowing in the surface coil. This circuit de-couples the coil elements, especially non-adjacent elements. As is well known, adjacent coil elements are typically de-coupled by different methods, including geometry, capacitive, and inductive de-coupling, but it is not always possible to de-couple by these methods therefore the parallel resonant circuit with lower input impedance preamplifier in each coil is necessary to de-couple from non-adjacent coils of the array.

However, using the traditional decoupling techniques of the prior art, either a good impedance matching with the pre-amplifier or a good decoupling (high decoupling impedance) may be achieved. However, simultaneous improvement of both of these parameters is very difficult and often impossible to obtain. Thus improvement in one comes generally at a deterioration in the other leading to unacceptable design compromises to obtain the best SNR available.

SUMMARY OF THE INVENTION

It is one object of the invention to provide an RF coil array which will decrease the compromise between de-coupling and matching by providing a high level of decoupling as well as an improved level of matching.

According to one aspect of the invention there is provided an RF coil array for use in a magnetic resonance system for detecting MR signals from a subject comprising:

a plurality of separate RF coil elements arranged in an array for receiving RF signals from the subject, each of the coil elements having a conductive loop with a pair of ends across which the signal is applied;

at least one of the coil element having a pre-amplifier circuit for receiving a signal from pair of ends of the coil element for amplification of the signal to submit to a signal analysis system;

the pre-amplifier circuit including a transistor and conditioning components in advance of the transistor arranged to determine a required impedance for the pre-amplifier circuit;

the conditioning components including an inductor and a capacitor;

said at least one of the coil elements having a preamplifier decoupling network connected across the pair of ends for generating a high impedance across the pair of ends so as to inhibit coupling in the coil from signals in adjacent and non-adjacent coils and coil elements of the array;

wherein the decoupling circuit comprises a capacitance which co-operates with the inductance of the conditioning circuit element to form a parallel resonant circuit to generate said high impedance;

and wherein the capacitance and the coil element are arranged with impedance values selected to define an output impedance which substantially matches the required impedance of the pre-amplifier circuit.

Typically all of the coil elements will include a preamplifier and a decoupling circuit component.

Preferably the values of the capacitance and the inductance are selected first such that the parallel resonant circuit maximizes the impedance across the pair of ends so as to inhibit coupling in the coil from signals in adjacent and non-adjacent coils of the array while allowing a certain range of difference between the output impedance of the coil element and the required impedance of the pre-amplifier circuit.

The primary characteristic in design of the parallel resonant circuit components is that the values produce maximized impedance, and these component values also provides a matching impedance as close as possible to that of the required impedance (e.g. 50 Ohm) of the amplifier. The tradition design of the parallel resonance circuit uses a inductor between the coil element and the preamplifier. The new design replaces the inductor with a trimmer capacitor. This change reduces the resistance and increases the Q factor of the parallel resonant circuit, thereby increasing the impedance without effecting the matching of the coil output to the required impedance of preamplifier.

The functions of the conditioning circuit element are as follows:

The conditioning circuit includes an inductor and capacitors to form a network which transforms the output coil loop impedance at input of the preamplifier to the required impedance at the input of the transistor.

Preferably the conditioning circuit element includes an inductor connected between lines from the ends of the coil carrying the signal to the preamplifier and defining said inductance.

According to a second aspect of the invention there is provided an RF coil array for use in a magnetic resonance system for detecting MR signals from subject comprising:

a plurality of separate RF coil elements arranged in an array for receiving RF signals from the subject, each of the coil elements having a conductive loop with a pair of ends across which the signal is applied;

at least one of the separate coil elements having a pre-amplifier circuit for receiving a signal from pair of ends of the coil element for amplification of the signal to submit to a signal analysis system;

the pre-amplifier circuit including a transistor and a conditioning circuit in advance of the transistor arranged to determine a required impedance for the pre-amplifier circuit;

the conditioning circuit element including an inductance;

said at least one of the coils having a decoupling network connected across the pair of ends for generating a high impedance across the pair of ends so as to inhibit coupling in the coil from signals in adjacent, non-adjacent coils and coil elements of the array, wherein the parallel resonant circuit is defined by a capacitance and the inductance of the conditioning circuit element of the pre-amplifier circuit;

and wherein an output impedance of the coil element is arranged to substantially match the required impedance of the pre-amplifier circuit.

According to a third aspect of the invention there is provided an RF coil array for use in a magnetic resonance image system for detecting MR signals from a subject comprising:

a plurality of separate RF coil elements arranged in an array for receiving RF signals from the subject, each of the coil elements having a conductive loop with a pair of ends across which the signal is applied;

at least one of the separate coil elements having a pre-amplifier circuit for receiving a signal from pair of ends of the coil element for amplification of the signal to submit to a signal analysis system;

the pre-amplifier circuit including a transistor and a conditioning circuit element in advance of the transistor arranged to determine a required impedance for the pre-amplifier circuit, the conditioning circuit element including an inductor;

said at least one of the coil elements having a first capacitor connected across the pair of ends and a second capacitor connected between one of the ends and the input of the pre-amplifier circuit, the first and second capacitors and the inductor from the preamplifier forming components of a parallel resonant circuit for generating a high impedance across the pair of ends so as to inhibit coupling in the coil from signals in adjacent and non-adjacent coil elements of the array coil;

and wherein an output impedance of the coil element is arranged to substantially match the required impedance of the pre-amplifier circuit.

Preferably the values of capacitance and the inductance in the parallel resonant circuit are selected such that the parallel resonant circuit maximizes the impedance across the pair of ends so as to inhibit coupling in the coil from signals in adjacent and non-adjacent coil elements of the array while the values selected allow some difference between the output impedance of the coil element and the input impedance of the pre-amplifier circuit.

Preferably the inductor of the parallel resonance circuit from the conditioning circuit of the preamplifier is connected between lines from the ends of the coil element carrying the signal to the preamplifier.

Preferably the parallel resonant circuit includes at least one further capacitor in the conditioning circuit element of the pre-amplifier circuit.

Preferably the parallel resonant circuit consists solely of the first and second capacitors, at least one further capacitor in the conditioning circuit element of the pre-amplifier circuit and the inductor in the conditioning circuit element of the pre-amplifier circuit.

Preferably said at least one further capacitor in the conditioning circuit element of the pre-amplifier circuit is variable.

Preferably the second capacitor is variable.

Preferably the first capacitor is fixed.

Preferably the values of the first and second capacitors are selected such that the parallel resonant circuit maximizes the impedance across the pair of ends so as to inhibit coupling in the coil from signals in adjacent and non-adjacent coil elements of the array while allowing some difference between the output impedance of the coil element and the input impedance of the pre-amplifier circuit.

The new design therefore includes using the existing built in inductor of the pre-amplifier conditioning circuit, which results in the pre-amplifier being part of the decoupling network. This new design improves both the matching and the decoupling simultaneously thereby producing better signal to noise ratio Using the built in inductor of the pre-amplifier simplifies the decoupling network, increases the power of preamplifier decoupling, reduces the loss of signal by eliminating an external inductor, and improves coil matching, therefore produce better images.

The pre-amplifier decoupling network is conventionally complicated to build and test. Using the preamplifier inductor simplifies the circuit construction.

The matching and the pre-amplifier decoupling of the phased array coil design is in conflict, where good decoupling would result in poor matching, and similarly, good matching would result in poor decoupling. This method produces good decoupling and significantly improved matching, both of which produce better images. Using fewer components, especially the inductors, is very important for the phased array coil design (larger number channel array coil), due to the limitation of space inside the coil enclosure.

The new design is more efficient and takes less space than traditional arrangements for de-coupling adjacent and non-adjacent coil elements by reducing the resistance of parallel resonant circuit of preamplifier decoupling network which uses the built in inductor of preamplifier, eliminating number of components and improving the SNR. This efficiency and reduced space requirements are even more beneficial in a coil with larger number of elements (e.g. 32 or even more Channel coil), specifically in combined imaging using a multiple phased array coils.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
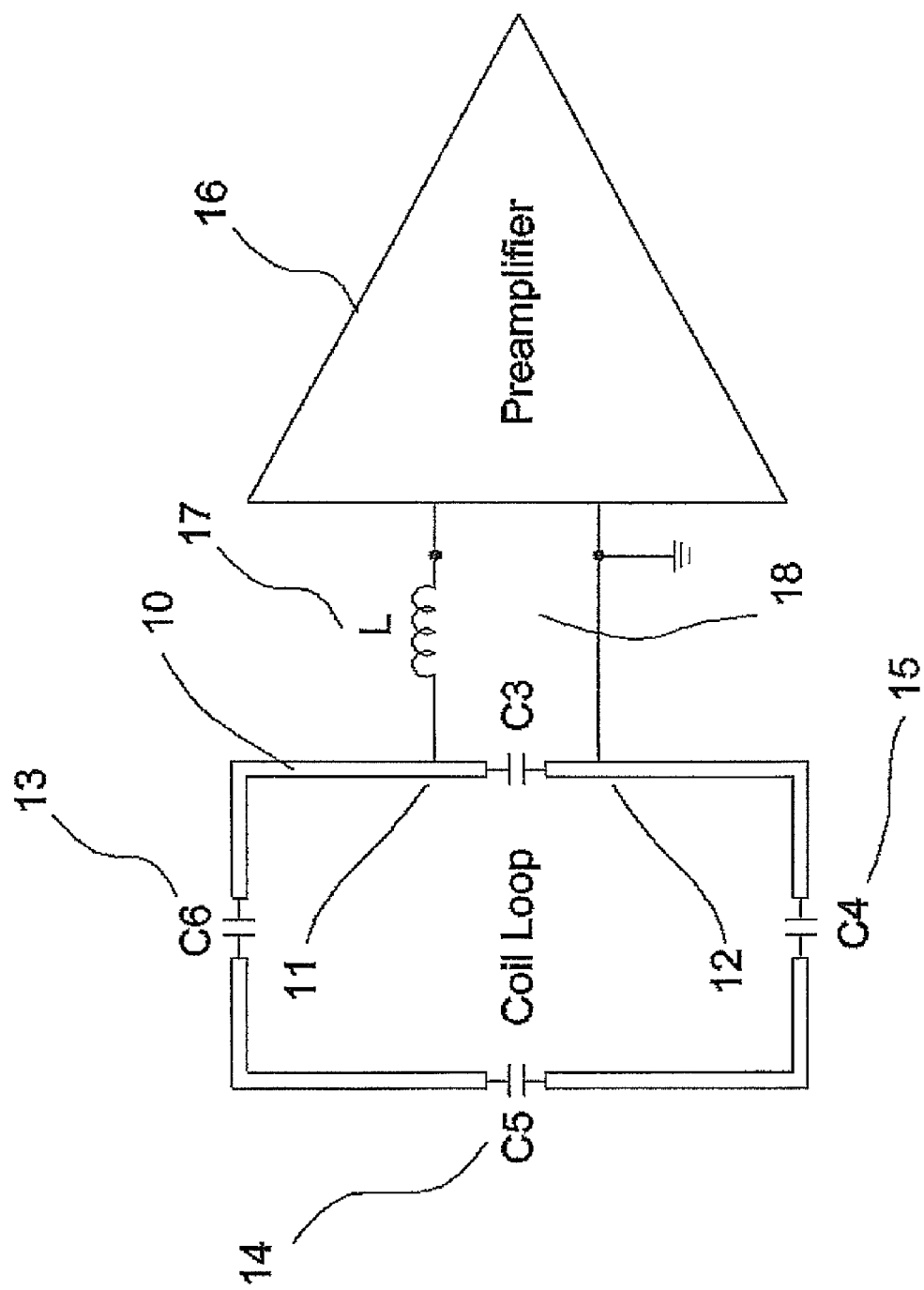
FIG. 1 is a schematic of one PRIOR ART coil element of a phased coil array with preamplifier decoupling circuit where the remaining coils are identical.

In FIG. 1 is shown a single coil of an RF phased coil array for use in a magnetic resonance system for detecting NMR signals from a subject. The array includes a series of RF coil elements arranged in an array for receiving RF signals from the subject, each of the coil elements having a conductive loop 10 with a pair of ends 11 and 12 across which the signal is applied. The coil includes a number of components in series as indicated at 13, 14 and 15 arranged for frequency tuning to the magnetic resonance frequency. The components 13, 14 and 15 are well known to persons skilled in the art of coil design so that further description is not required.

The coil element has a pre-amplifier circuit 16 for receiving a signal from the pair of ends 11 and 12 of the coil element 10 for amplification of the signal to submit to a signal analysis system There is also provided a preamplifier decoupling circuit 18 which is arranged to provides a high impedance across the ends 11 and 12 to inhibit coupling between the adjacent and non-adjacent coils. The preamplifier decoupling network consists of capacitors, inductor 17 and preamplifier arranged to form a parallel resonant circuit which is tuned to the magnetic resonance frequency and generates a very high impedance in the coil element which is seen by adjacent and non-adjacent coil elements, so as to reduce as far as possible the coupling in this coil element from signals in the adjacent and non-adjacent coil elements. In addition the preamplifier decoupling network is arranged to provide an output impedance of the coil circuit is matched as closely as possible to the required impedance of the pre-amplifier circuit. As is well known an optimum matching of the impedance maximizes the SNR.

Figure 2:
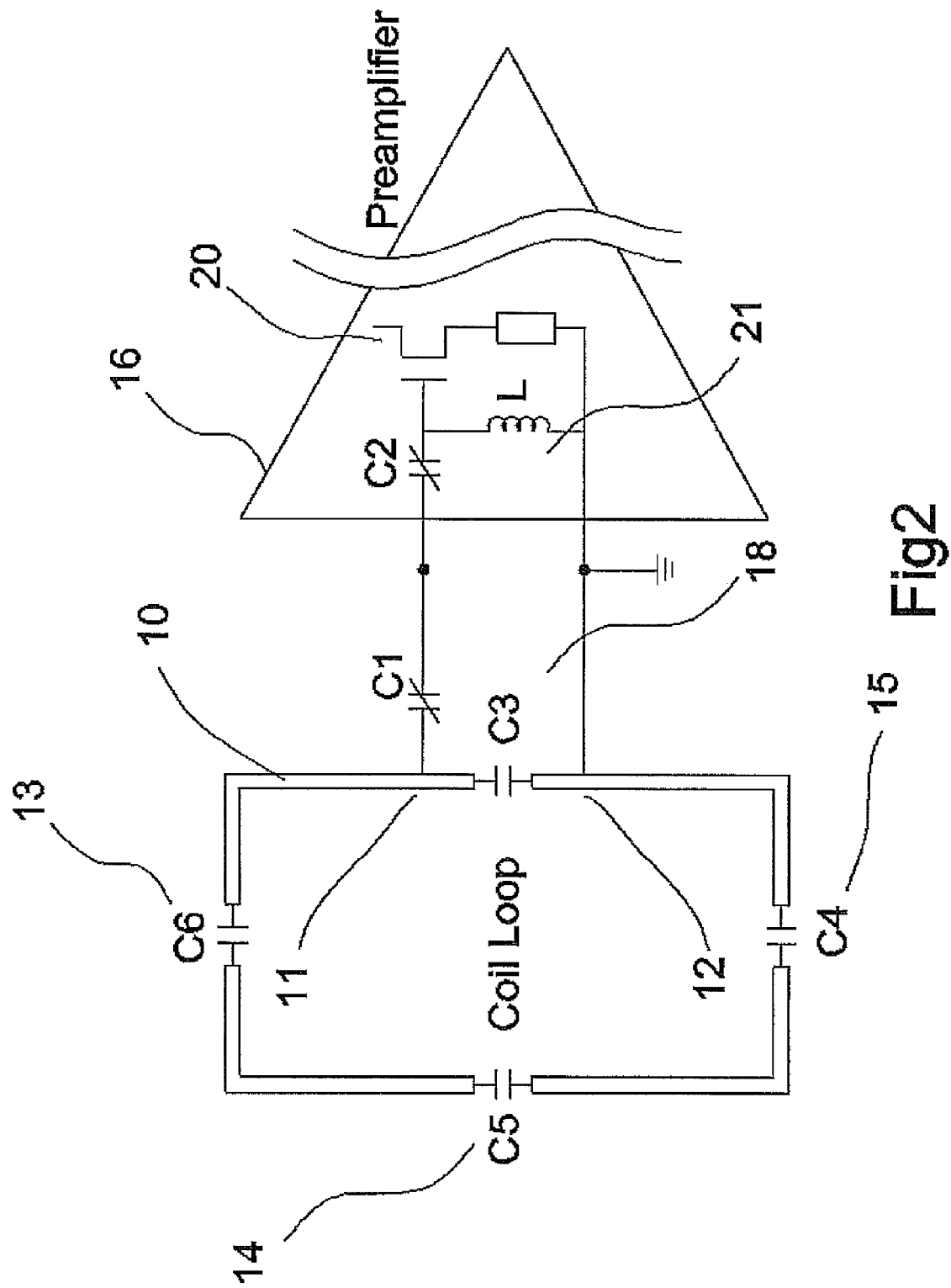
FIG. 2 is a schematic of one coil element of a phased coil array with preamplifier decoupling circuit according to the present invention.

Turning now to FIG. 2, the arrangement of the present invention is shown. The pre-amplifier can be of the type manufactured by any suitable preamplifier manufacturer such as SIEMENS (trademark) and comprises an amplifier 20 defined by transistors such as FET transistor and a conditioning circuit element 21 in advance of the transistor 20 arranged to determine a required impedance for the pre-amplifier circuit.

The conditioning circuit element includes a capacitor C2 and an inductor L.

The decoupling circuit element 18 connected across the pair of ends 11 and 12 is arranged for generating a high impedance across the pair of ends 11, 12 so as to inhibit coupling in the coil from signals in adjacent and non-adjacent coils of the array. The decoupling circuit element 18 comprises a capacitance defined by a first capacitor C3 connected across the ends 11 and 12, a capacitor C1 and the conditioning circuit of the preamplifier. The capacitance defined by the capacitors C1 and C3 co-operates with the inductance of the conditioning circuit element defined by the capacitor C2 and inductor L to form a parallel resonant circuit to generate the required high impedance.

The capacitance and the coil element are arranged with impedance values arranged to define an output impedance which substantially matches the required impedance of the pre-amplifier circuit.

The values of the capacitance and the inductance are selected such that the parallel resonant circuit maximizes the impedance across the pair of ends so as to inhibit coupling in the coil from signals in adjacent and non-adjacent coil elements of the array while allowing some difference between the output impedance of the coil element and the required impedance of the pre-amplifier circuit. That is the value of the capacitance and the inductance of the parallel resonance circuit is selected to work with the preamplifier to produce attenuation larger than 20 dB.

The pre-amplifier circuit including the transistor and the conditioning circuit element is defined as a separate component carried on a circuit board to which the coil and the decoupling circuit element are attached. Any suitable preamplifier, such as FET preamplifier with the conditioning circuit, is acceptable.

The parallel resonant circuit is thus defined by the capacitance and the inductance of the conditioning circuit element of the pre-amplifier circuit. The first and second capacitors and the inductor thus form components of the parallel resonant circuit for generating the high impedance across the pair of ends so as to inhibit coupling in the coil from signals in adjacent and non-adjacent coil elements of the array.

The capacitor C2 in the conditioning circuit element of the pre-amplifier circuit is variable. The second capacitor C1 also is variable. The first capacitor C3 is fixed.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. An RF coil array for use in a magnetic resonance system for detecting MR signals from a subject comprising:
   a plurality of separate RF coil elements arranged in an array for receiving RF signals from the subject, each of the coil elements having a conductive loop with a plurality of capacitors and with a pair of ends across one of the capacitors at which the signal is extracted;
   at least one of the coil elements having a pre-amplifier circuit for receiving the signal from the pair of ends of the coil element for amplification of the signal to submit to a signal analysis system;
   the pre-amplifier circuit including a transistor and conditioning components in advance of the transistor arranged to determine a required impedance for the pre-amplifier circuit;
   the conditioning components including an inductance and a capacitance;
   said at least one of the coil elements having a preamplifier decoupling network connected across the pair of ends at said one of the capacitors for generating a high impedance across the pair of ends so as to inhibit coupling in the coil from signals in adjacent and non-adjacent coils and coil elements of the array;
   wherein the decoupling circuit comprises a capacitance including said at least one capacitor which co-operates with the inductance of the conditioning circuit element to form a parallel resonant circuit to generate said high impedance;
   and wherein the capacitance and the coil element are arranged with impedance values selected to define an output impedance which substantially matches the required impedance of the pre-amplifier circuit.

2. The RF coil array according to claim 1 wherein the values of the capacitance and the inductance are selected such that the parallel resonant circuit maximizes the impedance generated across the pair of ends by the parallel resonant circuit while allowing some difference between the output impedance of the coil element and the required impedance of the pre-amplifier circuit.

3. The RF coil array according to claim 1 wherein the pre-amplifier circuit including the transistor and the conditioning circuit element is defined as a separate component carried on a circuit board to which the coil and the decoupling circuit element are attached.

4. An RF coil array for use in a magnetic resonance system for detecting MR signals from subject comprising:
   a plurality of separate RF coil elements arranged in an array for receiving RF signals from the subject, each of the coil elements having a conductive loop with a plurality of capacitors and with a pair of ends across one of the capacitors at which the signal is extracted;
   at least one of the separate coil elements having a pre-amplifier circuit for receiving the signal from the pair of ends of the coil element for amplification of the signal to submit to a signal analysis system;
   the pre-amplifier circuit including a transistor and a conditioning circuit in advance of the transistor arranged to determine a required impedance for the pre-amplifier circuit;
   the conditioning circuit element including an inductance;

said at least one of the coils having a parallel resonant circuit across the pair of ends at said one of the capacitors for generating a high impedance across the pair of ends so as to inhibit coupling in the coil from signals in adjacent, non-adjacent coils and coil elements of the array, wherein the parallel resonant circuit is defined by a capacitance including said at least one capacitor and the inductance of the conditioning circuit element of the pre-amplifier circuit;

and wherein an output impedance of the coil element is arranged to substantially match the required impedance of the pre-amplifier circuit.

5. The RF coil array according to claim 4 wherein the values of the capacitance and the inductance are selected such that the parallel resonant circuit maximizes the impedance generated across the pair of ends by the parallel resonant circuit while allowing some difference between the output impedance of the coil element and the required impedance of the pre-amplifier circuit.

6. The RF coil array according to claim 4 wherein the pre-amplifier circuit including the transistor and the conditioning circuit element is defined as a separate component carried on a circuit board to which the coil and the decoupling circuit element are attached.

7. An RF coil array for use in a magnetic resonance image system for detecting MR signals from a subject comprising:

a plurality of separate RF coil elements arranged in an array for receiving RF signals from the subject, each of the coil elements having a conductive loop with a pair of ends across which the signal is applied;

at least one of the separate coil elements having a pre-amplifier circuit for receiving the signal from the pair of ends of the coil element for amplification of the signal to submit to a signal analysis system;

the pre-amplifier circuit including a transistor and a conditioning circuit element in advance of the transistor arranged to determine a required impedance for the pre-amplifier circuit, the conditioning circuit element including an inductor;

said at least one of the coil elements having in the coil elements a first capacitor across which the pair of ends is connected and a second capacitor connected between one of the ends and the input of the pre-amplifier circuit, the first and second capacitors and the inductor from the preamplifier forming components of a parallel resonant circuit for generating a high impedance across the pair of ends so as to inhibit coupling in the coil from signals in adjacent and non-adjacent coil elements of the array coil;

and wherein an output impedance of the coil element is arranged to substantially match the required impedance of the pre-amplifier circuit.

8. The RF coil array according to claim 7 wherein the values of capacitance and the inductance in the parallel resonant circuit are selected such that the parallel resonant circuit maximizes the impedance across the pair of ends so as to inhibit coupling in the coil from signals in adjacent and non-adjacent coils of the array while the values selected allow some difference between the output impedance of the coil element and the required impedance of the pre-amplifier circuit.

9. The RF coil array according to claim 7 wherein the pre-amplifier circuit including the transistor and the conditioning circuit element is defined as a separate component carried on a circuit board to which the coil and the decoupling circuit element are attached.

10. The RF coil array according to claim 7 wherein the parallel resonant circuit includes at least one further capacitor in the conditioning circuit element of the pre-amplifier circuit.

11. The RF coil array according to claim 10 wherein the parallel resonant circuit consists solely of the first and second capacitors, at least one further capacitor in the conditioning circuit element of the pre-amplifier circuit and the inductor in the conditioning circuit element of the pre-amplifier circuit.

12. The RF coil array according to claim 10 wherein said at least one further capacitor in the conditioning circuit element of the pre-amplifier circuit is variable.

13. The RF coil array according to claim 7 wherein the second capacitor is variable.

14. The RF coil array according to claim 7 wherein the first capacitor is fixed.

* * * * *